United States Patent
Karasawa et al.

(10) Patent No.: US 7,037,758 B2
(45) Date of Patent: May 2, 2006

(54) SEMICONDUCTOR DEVICE, METHOD OF MANUFACTURING THE SAME, CIRCUIT BOARD AND ELECTRONIC APPARATUS

(75) Inventors: Fumiaki Karasawa, Ina (JP); Takeshi Yuzawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/642,737

(22) Filed: Aug. 19, 2003

(65) Prior Publication Data
US 2004/0180549 A1    Sep. 16, 2004

(30) Foreign Application Priority Data
Aug. 22, 2002    (JP)    ............... 2002-241827

(51) Int. Cl.
*H01L 21/48*    (2006.01)
*H01L 21/50*    (2006.01)
(52) U.S. Cl. .................. 438/113; 438/106; 438/612
(58) Field of Classification Search ................ 438/106, 438/107, 110, 111, 113, 612
See application file for complete search history.

(56) References Cited

U.S. PATENT DOCUMENTS

| | | | |
|---|---|---|---|
| 4,418,284 A * | 11/1983 | Ogawa et al. ............ 250/208.1 |
| 5,874,365 A * | 2/1999 | Tomita et al. ............... 438/747 |
| 6,005,474 A * | 12/1999 | Takeuchi et al. ............ 338/320 |
| 6,229,222 B1 * | 5/2001 | Ohuchi ....................... 257/787 |
| 6,353,267 B1 * | 3/2002 | Ohuchi et al. .............. 257/787 |
| 6,420,213 B1 * | 7/2002 | Nakajyo et al. ............ 438/118 |
| 6,713,880 B1 * | 3/2004 | Sahara et al. ............... 257/783 |

FOREIGN PATENT DOCUMENTS

| | | |
|---|---|---|
| JP | 61-152358 A | 7/1986 |
| JP | 02-069938 A | 3/1990 |
| JP | 09-148283 | 6/1997 |
| JP | 11-010532 | 1/1999 |
| JP | 2000-294578 A | 10/2000 |
| JP | 2001-148393 A | 5/2001 |
| JP | 2001-196404 A | 7/2001 |
| JP | 2002-075920 | 3/2002 |

* cited by examiner

*Primary Examiner*—Michael Trinh
*Assistant Examiner*—Pamela E Perkins
(74) *Attorney, Agent, or Firm*—Oliff & Berridge,PLC

(57) ABSTRACT

The invention provides a method of manufacturing a semiconductor that improves the productivity and the yield of a product, and grinds a semiconductor substrate so that it has almost uniform thickness. The method can include forming a protrusion on a semiconductor substrate having a first area and a second area surrounding the first area. The protrusion protruding above first area. A support being disposed on a surface on which the protrusion is formed, of the semiconductor substrate so that a through hole of the support overlaps with the first area. The semiconductor substrate can be grinded from a surface opposite to the surface on which the protrusion is formed.

57 Claims, 7 Drawing Sheets

SEMICONDUCTOR DEVICE, METHOD OF MANUFACTURING THE SAME, CIRCUIT BOARD AND ELECTRONIC APPARATUS

BACKGROUND OF THE INVENTION

1. Field of Invention

The present invention relates to a semiconductor device, a method of manufacturing the same, a circuit board, and an electronic apparatus.

2. Description of Related Art

It is known that a semiconductor wafer is grinded in order to pursue the miniaturizing of a semiconductor device. For example, in a technology of manufacturing a package of a semiconductor device in a wafer level (wafer level packaging), the process of grinding a back surface of a semiconductor wafer is performed after a resin layer, wiring, a protruding electrode and so on are disposed on a front surface of the semiconductor wafer. In this case, since the resin layer, the wiring, the protruding electrode and so on are not provided on the outer end of the semiconductor wafer where no products are obtained, the outer end is thinner than the center part of the wafer where products are obtained. Therefore, while grinding, the outer end of the semiconductor wafer is bent downward due to stress caused by grinding, thus making it difficult to grind the semiconductor wafer so that it has almost uniform thickness.

SUMMARY OF THE INVENTION

The present invention is intended to improve the productivity and the yield of a product. The present invention is also intended to grind a semiconductor substrate so that it has almost uniform thickness.

A method of manufacturing a semiconductor device according to the present invention can include the steps of forming a protrusion on a semiconductor substrate having a first area and a second area surrounding the first area, the protrusion protruding above the first area, and disposing a support on a surface on which the protrusion is formed, of the semiconductor substrate. Here, a part of the support overlapping with the second area is thicker than another part of the support overlapping with the first area. The method also includes the step of grinding the semiconductor substrate from a surface opposite to the surface on which the protrusion is formed.

According to the present invention, the grinding process can be performed with the support disposed on the semiconductor substrate. Since the part of the support overlapping with the second area is thicker than the part of the support overlapping with the first area, it can be prevented that the semiconductor substrate is bent by stress caused by grinding even if the protrusion makes a part of the semiconductor corresponding to the second area thinner than another part corresponding to the first area. Therefore, the semiconductor substrate can be grinded so that it has almost uniform thickness.

A method of manufacturing a semiconductor device according to the present invention can include the steps of disposing a resin layer on a first area of a semiconductor substrate, the semiconductor substrate having a second area surrounding the first area, and disposing a support on a surface on which the resin layer is disposed, of the semiconductor substrate. Here, a part of the support overlapping with the second area being thicker than another part of the support overlapping with the first area. The method also includes the step of grinding the semiconductor substrate from a surface opposite to the surface on which the resin layer is disposed.

According to the present invention, the grinding process can be performed with the support disposed on the semiconductor substrate. Since the part of the support overlapping with the second area is thicker than the part of the support overlapping with the first area, it can be prevented that the semiconductor substrate is bent by stress caused by grinding even if the resin layer makes a part of the semiconductor corresponding to the second area thinner than another part corresponding to the first area. Therefore, the semiconductor substrate can be grinded so that it has also uniform thickness.

A method of manufacturing a semiconductor device according to the present invention can include the steps of disposing a resin layer on a first area of a semiconductor substrate, the semiconductor substrate having a second area surrounding the first area, disposing a protruding electrode on the resin layer, and disposing a support on a surface on which the resin layer is disposed, of the semiconductor substrate. Here, a part of the support overlapping with the second area is thicker than another part of the support overlapping with the first area. The method also includes the step of grinding the semiconductor substrate from a surface opposite to the surface on which the resin layer is disposed.

According to the present invention, the grinding process can be performed with the support disposed on the semiconductor substrate. Since the part of the support overlapping with the second area is thicker than the part of the support overlapping with the first area, it can be prevented that the semiconductor substrate is bent by stress caused by grinding even if the resin layer and the protruding electrode make a part of the semiconductor corresponding to the second area thinner than another part corresponding to the first area. Therefore, the semiconductor substrate can be grinded so that it has an almost uniform thickness.

In the method of manufacturing a semiconductor device, the second area may be an outer end of the semiconductor substrate. Thus, it can be possible to prevent the outer end of the semiconductor substrate from being bent by stress caused by grinding.

In the method of manufacturing a semiconductor device, the support may be formed by coating the semiconductor substrate with resin by spin-coating in the step of disposing the support. Thus the support can be easily formed.

In the method of manufacturing a semiconductor device, the step of disposing the support may include the step of forming a raised portion of the resin on the second area.

In the method of manufacturing a semiconductor device, the step of disposing the support may include the step of pressing to planarize the surface of the resin.

In the method of manufacturing a semiconductor device, the support may include an adhesive sheet having an adhesive layer thicker than the height of the protrusion. In addition, the step of disposing the support may include the step of forming the support by pressing the semiconductor substrate against the adhesive sheet to eject at least a part of the adhesive layer outside the protrusion.

In the method of manufacturing a semiconductor device, the support may include an adhesive sheet having an adhesive layer thicker than the thickness of the resin layer. In addition, the step of disposing the support may include the step of forming the support by pressing the semiconductor substrate against the adhesive sheet to eject at least a part of the adhesive layer outside the resin layer.

In the method of manufacturing a semiconductor device, the support may include an adhesive sheet having an adhesive layer thicker than the total thickness of the resin layer and the protruding electrode. In addition, the step of disposing the support may include the step of forming the support by pressing the semiconductor substrate against the adhesive sheet to eject at least a part of the adhesive layer outside the resin layer and the protruding electrode.

A method of manufacturing a semiconductor device according to the present invention includes the steps of forming a protrusion on a semiconductor substrate having a first area and a second area surrounding the first area, the protrusion protruding above the first area, and disposing a support on a surface on which the protrusion can be formed, of the semiconductor substrate so that a through hole of the support overlaps with the first area. The method also includes the step of grinding the semiconductor substrate from a surface opposite to the surface on which the protrusion is formed.

According to the present invention, the grinding process can be performed with the support disposed on the semiconductor substrate. Since the part of the support overlapping with the first area is a through hole, it can be prevented that the semiconductor substrate is bent by stress caused by grinding even if the protrusion makes a part of the semiconductor substrate corresponding to the second area thinner than another part corresponding to the first area. Therefore, the semiconductor substrate can be grinded so that it has an almost uniform thickness.

A method of manufacturing a semiconductor device according to the present invention can include the steps of disposing a resin layer on a first area of a semiconductor substrate, the semiconductor substrate having a second area surrounding the first area, and disposing a support on a surface on which the resin layer is disposed, of the semiconductor substrate so that a through hole of the support overlaps with the first area. The method also includes the step of grinding the semiconductor substrate from a surface opposite to the surface on which the resin layer is disposed.

According to the present invention, the grinding process can be performed with the support disposed on the semiconductor substrate. Since the part of the support overlapping with the first area is a through hole, it can be prevented that the semiconductor substrate is bent by stress caused by grinding even if the resin layer makes a part of the semiconductor substrate corresponding to the second area thinner than another part corresponding to the first area. Therefore, the semiconductor substrate can be grinded so that it has an almost uniform thickness.

A method of manufacturing a semiconductor device according to the present invention can include the steps of disposing a resin layer on a first area of a semiconductor substrate, the semiconductor substrate having a second area surrounding the first area, disposing a protruding electrode on the resin layer. The method also can include the steps of disposing a support on a surface on which the resin layer is disposed, of the semiconductor substrate so that a through hole of the support overlaps with the first area, and grinding the semiconductor substrate from a surface opposite to the surface on which the resin layer is disposed.

According to the present invention, the grinding process can be performed with the support disposed on the semiconductor substrate. Since the part of the support overlapping with the first area is a through hole, it can be prevented that the semiconductor substrate is bent by stress caused by grinding even if the resin layer and the protruding electrode make a part of the semiconductor substrate corresponding to the second area thinner than another part corresponding to the first area. Therefore, the semiconductor substrate can be grinded so that it has an almost uniform thickness.

In the method of manufacturing a semiconductor device, the second area may be an outer end of the semiconductor substrate. Thus it can be prevented that the outer end of the semiconductor substrate is bent by stress caused by grinding the semiconductor substrate.

In the method of manufacturing a semiconductor device, the support may be formed on the periphery of the through hole and have a step for disposing the outer end of the semiconductor substrate. This can restrict any lateral shifting of the semiconductor substrate, for example.

In the method of manufacturing a semiconductor device, the support can be made of resin.

In the method of manufacturing a semiconductor device, the step of disposing the support may include the step of curing the resin.

In the method of manufacturing a semiconductor device, the first area may be an area of an effective chip having an integrated circuit and becoming a product. In addition, the second area may be an area of a periphery chip that does not become a product.

In the method of manufacturing a semiconductor device, the semiconductor substrate may be cut with the support disposed on the semiconductor substrate after the step of grinding the semiconductor substrate.

In the method of manufacturing a semiconductor device, the support may be removed from the semiconductor substrate after the step of grinding the semiconductor substrate.

A method of manufacturing a semiconductor device according to the present invention can include the steps of disposing a resin layer on a first and a second areas of a semiconductor substrate, the first area becoming a product and the second area surrounding the first area not becoming a product, disposing a protruding electrode on the resin layer and above the first and the second areas, and grinding the semiconductor substrate from a surface opposite to the surface on which the resin layer is disposed.

According to the present invention, the grinding process can be performed with the resin layer and the protruding electrode disposed on the first and second areas. Since the resin layer and the protruding electrode are disposed on both the first area and the second area surrounding the first area, it can be prevented that the semiconductor substrate is bent by stress caused by grinding the semiconductor substrate. Therefore, the semiconductor substrate can be grinded so that it has an almost uniform thickness.

In the method of manufacturing a semiconductor substrate, the second area may include an area of a part that includes a side face of the semiconductor substrate and becomes a semiconductor chip.

A semiconductor device according to the present invention is manufactured by the method described above.

A circuit board according to the present invention is equipped with the semiconductor device described above.

An electronic apparatus according to the present invention includes the electronic apparatus described above.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
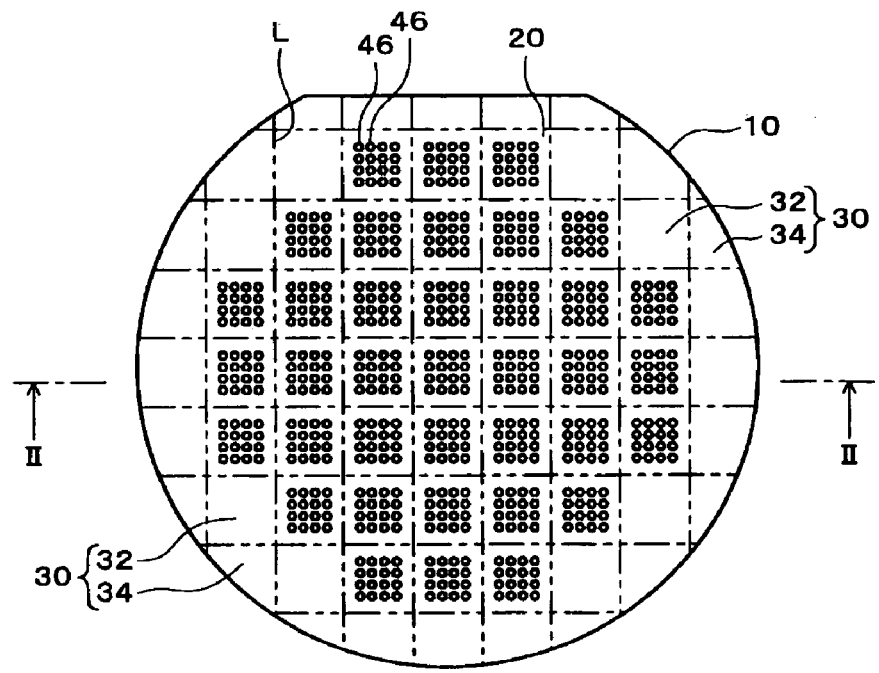
FIG. 1 shows a semiconductor substrate used in a first embodiment of the present invention.
Figure 2:
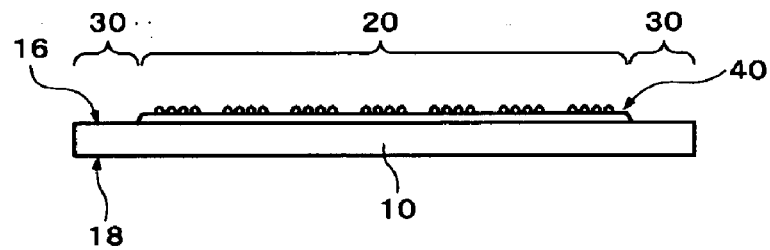
FIG. 2 is a cross-sectional view along II—II line of FIG. 1.
Figure 3:
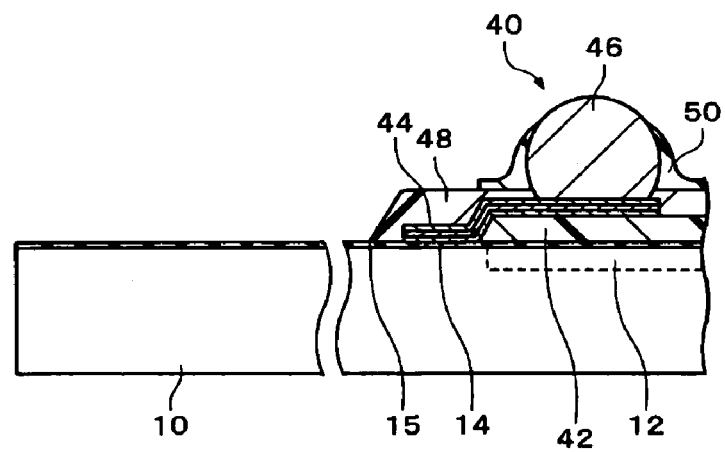
FIG. 3 is a partial enlarged view of the semiconductor substrate of FIG. 2.
Figure 4:
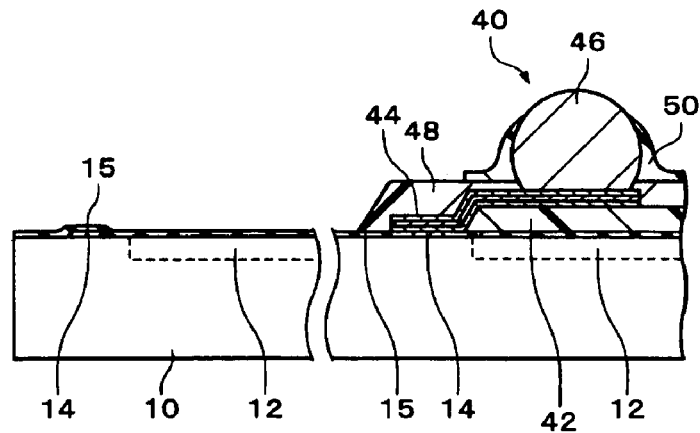
FIG. 4 is a partial enlarged view of a semiconductor device according to a modification of the first embodiment of the present invention.

Hereinafter, the preferred embodiments of the present invention will be explained referring to the corresponding drawings. FIGS. 1 through 8 are diagrams explaining a method of manufacturing a semiconductor device according to a first embodiment of the present invention. A semiconductor substrate 10 is used in this embodiment. Note that FIG. 1 shows a plan view of the semiconductor substrate, FIG. 2 shows a cross-sectional view along II—II line of FIG. 1, FIG. 3 shows a partial enlarged view of the semiconductor substrate of FIG. 2, and FIG. 4 shows a partial enlarged view of a modification of the semiconductor substrate.

The semiconductor substrate 10 may be a semiconductor wafer (for example, a silicon wafer). A plan shape of the semiconductor wafer may be, for example, circle (in FIG. 1, a part of a circle is cut off). As a modification, the semiconductor substrate 10 may be a divided substrate which is a semiconductor wafer divided in several parts, (for example, quarters). A plan shape of the divided substrate is, for example, a sector formed by cutting the semiconductor wafer along a diameter (or a radius).

As shown in FIG. 3, an integrated circuit 12 here including a plurality of integrated circuits is formed on the semiconductor substrate 10. It is also possible to form the integrated circuit 12 on each part that becomes a semiconductor chip, of the semiconductor substrate 10.

As shown in FIG. 3, the semiconductor substrate 10 has a pad 14 here can include a plurality of pads. The pad 14 here can include a group (two or more) pads that may be formed on the part of the semiconductor substrate 10 that is to become a semiconductor chip. The integrated circuit 14 formed on the area becoming a semiconductor chip can be connected to the pad 14 formed on the area becoming a semiconductor chip. If the plan shape of a semiconductor chip is rectangular (square or oblong), the pad 14 may be formed along at least one side (often two facing sides or all four sides) or may be formed on the center of the part becoming a semiconductor chip. A protective film 15 (e.g., a passivation film) made of SiN, $SiO_2$, MgO or the like may be formed on the semiconductor substrate 10 avoiding the pad 14. The protective film 15 is an insulation film. The protective film 15 has an opening above any of the pad 14 formed on at least the part becoming a semiconductor chip.

The semiconductor substrate 10 has a first area 20 (in FIG. 1, an area where a protruding electrode 46 is formed) and a second area 30 (in FIG. 1, the remaining area). The semiconductor substrate 10 has a plurality of portions that are to become semiconductor chips. A cut line L indicates a border between the adjacent portions becoming the semiconductor chips. The second area 30 is an area having a portion, including at least an outer circumferential side of the semiconductor substrate 10, among a plurality of the portions to become semiconductor chips. The first area 20 is an area surrounded by the second area 30. The first area 20 may be provided on the center of the semiconductor substrate 10. In this case, the second area 30 may be provided in accordance with the first area 20, for example on the outer end (e.g., integrally with the outer end) of the semiconductor substrate 10. The positions of the areas 20 and 30 can be previously decided. The second area 30 may be used as a handle section for handling the semiconductor substrate 10. Otherwise, the first area 20 may be an area where a plurality of portions which are to become products assemble. In this case, the second area 30 may be the remaining area that does not become a product. The first area 20 consists of a portion that becomes a semiconductor chip and is defined by only the cut line L. Namely, in the first area 20, one block defined by the cut line L denotes a part becoming a semiconductor chip. The second area 30, in contrast, is an area having a part 34 which becomes a semiconductor chip and is defined by both the outer circumferential side of the semiconductor substrate 10 and the cut line L.

Here, the integrated circuit 12 and the pad 14 are formed in the first area 20. Furthermore, in the first area 20, the protective film 15 has an opening above the pad 14. The pad 14 is electrically connected to the integrated circuit 14.

In the example shown in FIG. 1, the second area 30 includes a part 32 which become a semiconductor chip and is defined by only the cut line L. This enlarges the second area 30, so that the semiconductor substrate 10 can be easily handled. In addition, the second area 30 may consist only of the part 34 that become a semiconductor chip and includes at least the outer circumferential side of the semiconductor substrate 10. Thus, products can be manufactured as many as possible from a single of the semiconductor substrate 10.

In another example shown in FIG. 3, neither the integrated circuit 12 nor the pad 14 are formed on the second area 30. In other words, the area where the integrated circuit 12 is not formed or the area where the pad 14 is not formed can be referred to as the second area 30.

As a modification, as shown in FIG. 4, the integrated circuit 12 or the pad 14 may be formed on at least a part of the second area 30 (e.g., the part 32 which is to become a semiconductor chip). As shown in FIG. 4, the pad 14 formed on the second area 30 (e.g., the part 32 becoming a semiconductor chip) may be covered by the protective film 15 without forming an opening for exposing the pad 14 on the protective film 15.

The semiconductor substrate 10 has a first surface 16 on which the pad 14 is formed and a second surface 18 opposite hereto. Furthermore, a protrusion 40 is formed on the first surface 16 by disposing at least one kind of member thereon (examples of the member shown in FIG. 3 are resin layers 42, 48 and 50, wiring 44, and a protruding electrode 46). The protrusion 40 protrudes above the first area 20. At least one kind of the member may be formed only on the first area 20. Alternatively, at least one kind of the member may be formed on both the first area 20 and the second area 30 so that the member on the first area 20 is raised higher than that on the second area 30.

As shown in FIG. 3, the resin layer 42 is formed on a plurality of parts that becomes semiconductor chips, of the first area 20. The resin layer 42 may include a single layer or a plurality of layers. The resin layer 42 is formed avoiding the pad 14. For example, if the pad 14 is formed on an outer end of a part becoming a semiconductor chip, the resin layer 42 is formed on the center part of the part becoming a semiconductor chip. The resin layer 42 has a stress reducing function. The resin layer 42 may be made of resin, such as polyimide resin, silicone modified polyimide resin, epoxy resin, silicone modified epoxy resin, benzocyclobutene (BCB), and polybenzoxazole (PBO). The resin layer 42 may be formed between the semiconductor substrate 10 and the protruding electrode 46.

The wiring 44 including at least a single of layer (a plurality of layers, in FIG. 3) is formed on the pad 14 and the resin layer 42. For example, the wiring 44 may be formed by disposing one, or two or more of copper (Cu), chromium (Cr), titanium (Ti), nickel (Ni), titanium-tungsten (TiW), gold (Au), aluminum (Al), nickel-vanadium (NiV), and tungsten (W). If the pad 14 is formed on the outer end of the part becoming a semiconductor chip, the wiring 44 extends toward the center of the part. The wiring 44 may have a land whose area is larger than the area of the line part. In this case, the land is formed on the resin layer 42. A wiring pattern is formed on the resin layer 42 by forming the wiring 44 connected to the pad 14 here including a plurality of (a group of) pads.

The protruding electrode 46 (e.g., an external terminal) is formed on the wiring 44. The protruding electrode 46 may be made of a brazing filler metal. The brazing filler metal is a metal (for example, an alloy) having electro-conductivity and is melted for establishing electrical connection. The brazing filler metal may be formed of either soft solder and hard solder. The protruding electrode 46 is formed on, for example the land of the wiring 44. Forming the protruding electrode 46 avoiding above the pad 14 can prevent stress applied to the protruding electrode 46 from being directly applied to the pad 14. The protruding electrode 46 is, for example, a solder ball or the like, and is used for electrically connecting a circuit board and a part becoming a semiconductor chip each other (see FIG. 8).

The resin layer 48 (e.g., solder resist layer) may be formed above the wiring 44 except the part where the protruding electrode 46 is formed (e.g., the land). In addition, the resin layer 50 may be formed around the protruding electrode 46. The resin layer 50 covers the lower end (the root part) and the center part of the protruding electrode 46. The upper end of the protruding electrode 46 is exposed from the resin layer 50. Namely, in order to electrically connect the protruding electrode 46 to, for example, a circuit board, at least a part of the protruding electrode 46 is exposed from the resin layer 50. For example, an opening is provided to the resin layer 50, and the upper end of the protruding electrode 46 is exposed from the resin layer 50 through the opening. The connection of the protruding electrode 46 and the wiring 44 can be reinforced by the resin layer 50. Thus, it is possible to avoid the concentration of stress and disperse it. Furthermore, it can be avoided by the resin layer 50 that a foreign matter caused by grinding and cutting processes, described in greater detail below, enters between the protruding electrode 46 and the wiring 44.

Here, apart from the above example, a part of the resin layers 42, 48 and 50, the wiring 44, and the protruding electrode 46 may be disposed on the second area 30. For example, except the protruding electrode 46, any one, or two or more of the resin layer 42, 48 and 50, the wiring 44 can be disposed on the second area 30. Even in this case, by providing the protruding electrode 46 on the first area 20, the protrusion 40 raised higher than the second area 30 is formed on the first area 20.

Figure 5:
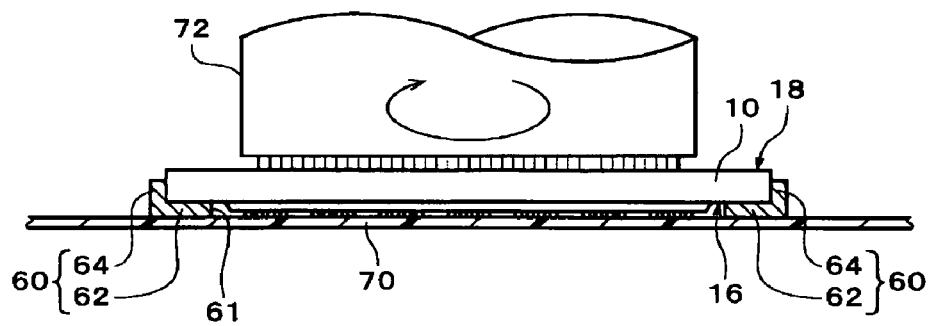
FIG. 5 shows a method of manufacturing a semiconductor device of the first embodiment of the present invention.

As shown in FIG. 5, the second surface 18 of the semiconductor substrate 10 (the surface opposite to the surface on which the pad 14 is formed) is grinded. Since the protrusion 40 is formed on the center part of the semiconductor substrate 10, the outer end which is thinner than the center part is easy to be bent by pressure applied during grinding. Therefore, a support 60 is used in this embodiment. The support 60 supports at least the second area 30 out of the first and the second areas 20 and 30 of the semiconductor substrate 10, from a side of the first surface 16.

The support 60 may be a mold whose shape is predetermined. The support 60 may be formed of metal, such as stainless steel, or may be formed of resin, such as polyethylene terephthalate (PET).

Figure 6:
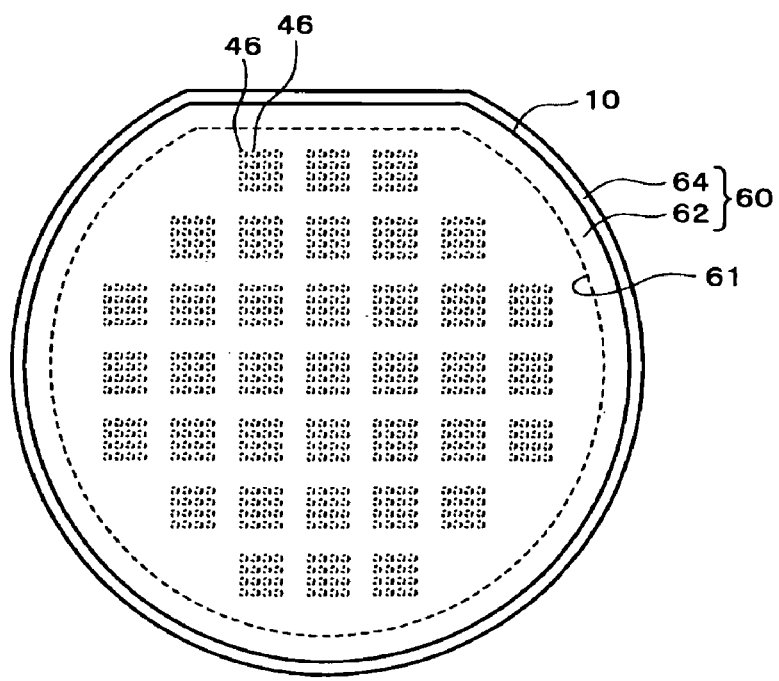
FIG. 6 shows the method of manufacturing a semiconductor device of the first embodiment of the present invention.

In the example shown in FIG. 5, the support 60 has a first support portion 62 that supports the semiconductor substrate 10 from a side of the first surface 16. The first support portion 62 may support only the second area 30. The first support portion 62 may support only the outer end. Although the first support portion 62 may partially support the outer end along the periphery thereof, it may also support integrally the outer end along the periphery as shown in FIG. 6. The support 60 may be a ring shape along the outer end of the semiconductor substrate 10. Namely, the support 60 has a through hole 61. The support 60 may by disposed so that the through hole 61 is located on a position corresponding to the first area 20 so as to set the protrusion 40 on the first area 20 in an opening of the through hole 61. Furthermore, it is preferable that the first support portion 62 supports at least the outermost part of the semiconductor substrate 10. This can greatly reduce the amount of downward bending of the outermost part of the semiconductor substrate 10. Here, it is preferable that the first support portion 62 has a thickness larger than a step between the second area 30 and the top of the protrusion 40.

In addition, as a modification, the first support 62 may also support the first area 20 (specifically, the protrusion 40). In this case, the support is formed so that a part overlapping with the second area 30 is thicker than a part overlapping with the first area.

The support 60 may further include a second support portion 64. The second support portion 64 supports the outer circumferential side of the semiconductor substrate 10. This can effectively receive stress generated on the semiconductor substrate 10 in the lateral direction (a direction parallel to the first surface 16 (or the second surface)). The second support portion 64 is formed as being raised in the thickness direction. In other words, the support 60 has the first support portion 62 and the second support portion 64 which is disposed outer the first support portion 62 and is thicker than the first support portion 62. The second support portion 64 is formed so that the thickness thereof is smaller than the thickness of the semiconductor substrate 10 after grinded. In a case where the support 60 has both the first and the second support portions 62 and 64, the outer end of the semiconductor substrate 10 is aligned with a corner formed by the first and the second support portions 62 and 64 (see FIGS. 5 and 6). Namely, a step is formed on the periphery of the through hole 61 of the support 60, and the outer end of the semiconductor substrate 10 is disposed on the step.

In the grinding process, as shown in FIG. 5, a side of the first surface 16 of the semiconductor substrate 10 may be maintained by a tape (a holding body) 70. Specifically, an upper end (e.g., the protruding electrode 46) of the protrusion 40 is held by the tape 70. The tape 70 may have adhesion. For example, a ultraviolet rays (UV) tape including UV curable resin as an adhesive may be used as the tape 70. Furthermore, in a case of a UV tape, since the adhesion thereof can be easily weakened by UV irradiation, it is easily separated after the grinding process.

When the tape 70 is used, the support 60 (specifically, the first support portion 62) is disposed between the semiconductor substrate 10 and the tape 70. The support 60 may be held by the tape 70. Furthermore, the semiconductor substrate 10 is grinded by using a grinding tool 72 after the tape 70 is placed on a stage not shown in the drawings. The grinding tool 72 grinds the semiconductor substrate 10 thinly by moving in a lateral direction while rotating on the semiconductor substrate 10. By using a mold of predetermined shape as the support 60, the process is easily performed by setting the mold on the predetermined position.

Figure 7:
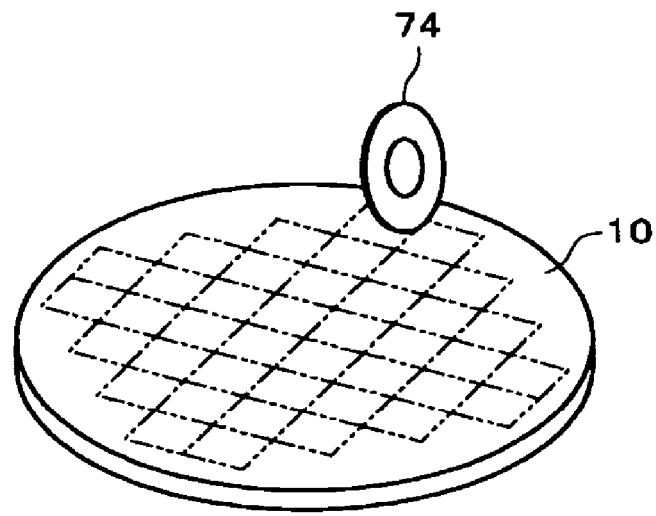
FIG. 7 shows the method of manufacturing a semiconductor device of the first embodiment of the present invention.
Figure 8:
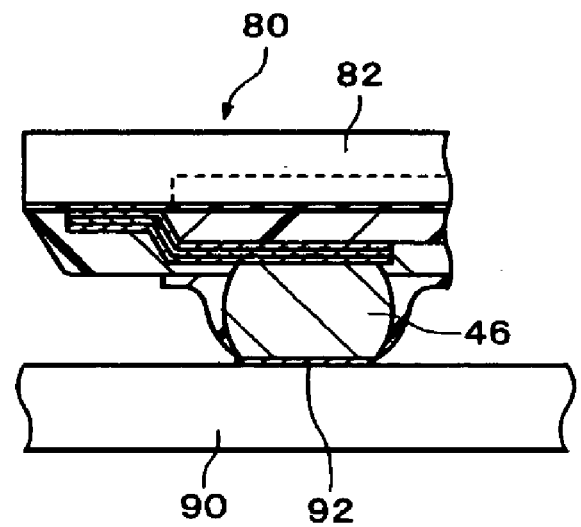
FIG. 8 shows a circuit board equipped with the semiconductor device according to the first embodiment of the present invention.

Then, as shown in FIG. 7, the semiconductor substrate 10 is cut with, for example a blade 74 into every piece of the integrated circuit 12. By cutting the semiconductor substrate 10, a plurality of products (a semiconductor chip 82) can be obtained from the first area 20. The semiconductor chip 82 has been thinned by grinding the surface opposite to the surface on which the pad is formed. The semiconductor chip 82 is provided with the resin layers 42, 48 and 50, and the wiring 44, and the brazing filler metal 46 so as to become a semiconductor device 80. This semiconductor device is categorized as CSP (chip scale package) because its package size is nearly equal to the size of a semiconductor chip.

According to the present embodiment, in the process of grinding the semiconductor substrate 10, at least the second area 30 is supported by the support 60. Thus, bending of the semiconductor substrate 10 due to stress during grinding can be greatly reduced even if the part corresponding to the second area 30 becomes thin by forming the protrusion 40 on the first area 20. Therefore, the semiconductor substrate 10 can be grinded. so that it has almost uniform thickness.

Furthermore, since it can be achieved that the thickness of the center part of the semiconductor substrate 10 and the thickness of the part near the outer end thereof are almost same, semiconductor chips with predetermined thickness can be obtained as many as possible from a single of the semiconductor substrate 10, thus improving the yield of the semiconductor device.

In the present embodiment, it should be understood that the protrusion 40 formed on the first surface 16 is not limited to the above-mentioned examples. The protrusion 40 may be, for example a protruding electrode stacked on the pad 14. The protruding electrode is formed by, for example a plating method (such as an electroless plating method or an electrolytic plating method). The present invention can be effective when it is applied in a case where a protrusion is formed on a surface of the semiconductor substrate 10.

Figure 12:
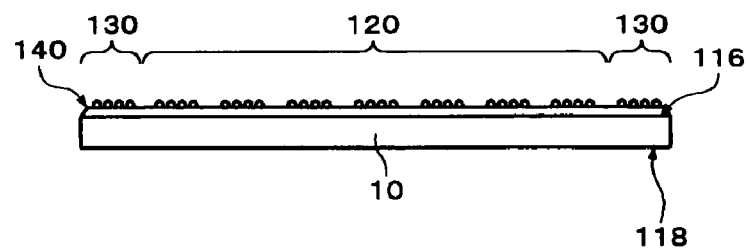
FIG. 12 is a cross-sectional view along XII—XII line of FIG. 11.

FIG. 12 is a drawing showing a circuit board equipped with the semiconductor device. Formed on a circuit board 90 is a wiring pattern 92 to which the protruding electrode 46 is bonded. The details of the semiconductor device according to the present embodiment are as described above, and the semiconductor device has the effect explained in the above description regarding the manufacturing method.

It should be understood that the present invention is not limited to the above described embodiment, but can also be applied to various kinds of modifications. In the following explanations regarding other embodiments, issues (a structure, an action, a function, or an effect) common to other embodiments and issues assumable from other embodiments will be omitted. Note that the present invention includes issues achieved by combining a plurality of embodiments.

Figure 9:
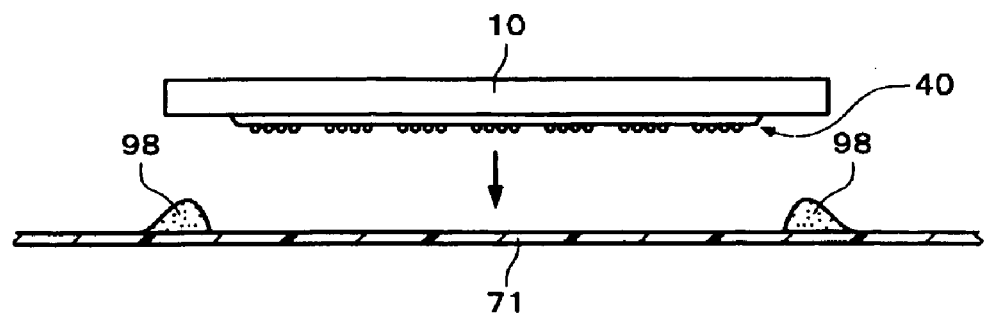
FIGS. 9(A) through 9(C) show a method of manufacturing a semiconductor device according to a second embodiment of the present invention.
Figure 9:
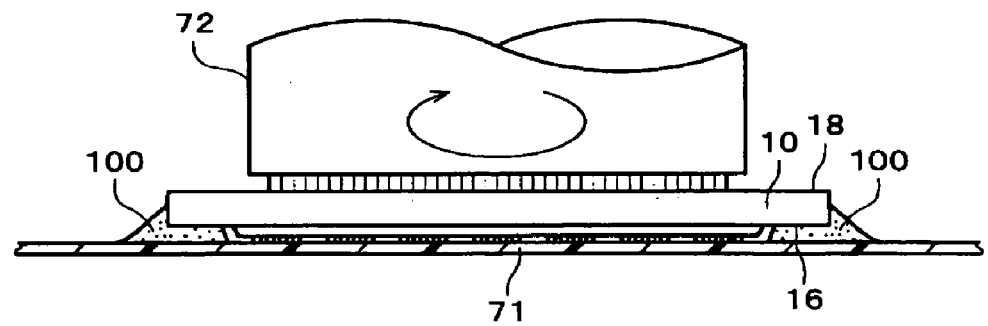
Figure 9:
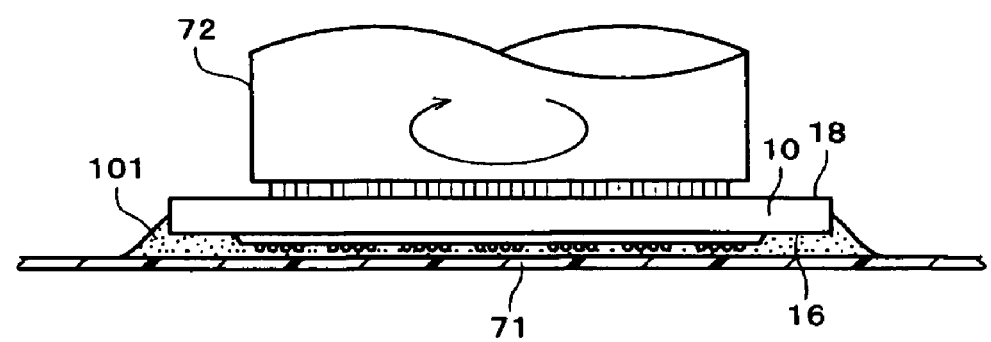

FIGS. 9(A) and 9(B) are drawings explaining a method of manufacturing a semiconductor device according to a second embodiment of the present invention. In the present embodiment, a support 100 that includes an adhesive layer 98 and an adhesive sheet 71 is used in the grinding process. The support 100 supports at least the second area 30 of the semiconductor substrate 10 from a side of the first surface 16 thereof. The semiconductor substrate 10 is the same as explained in the above embodiment.

In the example shown in FIG. 9(A), the adhesive layer 98 for holding the semiconductor substrate 10 is provided on the adhesive sheet (holding body) 71. The adhesive layer 98 may be, as shown in FIG. 9(A), in a paste form or in a sheet form. The adhesive layer 98 and the adhesive sheet 71 may be separated or integrated. The adhesive layer 98 is provided on the adhesive sheet 71 so that the thickness of the adhesive layer 98 is larger than the height of the top of the protrusion 40. The adhesive layer 98 has a property to be cured (the shape is fixed) when predetermined energy (such as heat and light) is applied. The adhesive layer 98 may be made of resin (e.g., thermosetting resin). In a case of a paste form, the adhesive layer 98 may be coated by using a dispenser and the like. As shown in FIG. 9(A), the adhesive layer 98 may be provided so that it directly contacts the second area 30 of the semiconductor substrate 10 avoiding the first area 20 thereof. The adhesive layer 98 is formed so as to support the second area 30 of the semiconductor substrate 10 partially or integrally along the periphery of the semiconductor substrate 10. Here, the adhesive layer 98 may be disposed on the semiconductor substrate 10.

As shown in FIG. 9(B), the adhesive layer 98 is cured while keeping the semiconductor substrate 10 in the grinding position. In the example shown in FIG. 9(B), the adhesive layer 98 is cured while the semiconductor substrate 10 is held by the adhesive sheet 71. In this case, the shape of the adhesive layer 98 may be adjusted by pressing the semiconductor substrate 10 from a side of the second surface 18.

The support 100 may extend from the semiconductor substrate 10. Namely, at least a part of the adhesive layer 98 is ejected outside the protrusion 40 by pressing the semiconductor substrate 10 against the adhesive sheet 71. This allows the height of the semiconductor substrate 10 to be easily adjusted. Therefore, the semiconductor substrate 10 may be supported so that the second surface 18 is almost horizontal. Furthermore, stress applied in the lateral direction (a direction parallel to the first surface 16 (or the second surface 18)) of the semiconductor substrate 10 can be effectively received by the support 100. Here, it can be also said that the support 100 has a first support portion supporting the semiconductor substrate 10 from a first surface side and a second support portion supporting a side end of the semiconductor substrate 10.

Then, in the process of cutting the semiconductor substrate 10, the semiconductor substrate 10 may be cut while contacting the adhesive layer 98 and the adhesive sheet 71. Thus, the first surface 16 of the semiconductor substrate 10 can be protected from a foreign matter caused in the cutting process.

As a modification shown in FIG. 9(C), the adhesive layer 98 may be provided so as to contact the whole surface on which the protrusion 40 is formed, of the semiconductor substrate 10, and a support 101 may be disposed on the semiconductor substrate 10. Specifically, the first surface 16 of the semiconductor substrate 10 may be covered by the adhesive layer 98.

According to the present embodiment, the support 100 of predetermined thickness can be easily formed in accordance with the semiconductor substrate 10 even if, for example, the height of the protrusion 40 on the first area 20 changes depending on the semiconductor substrate 10.

Figure 10:
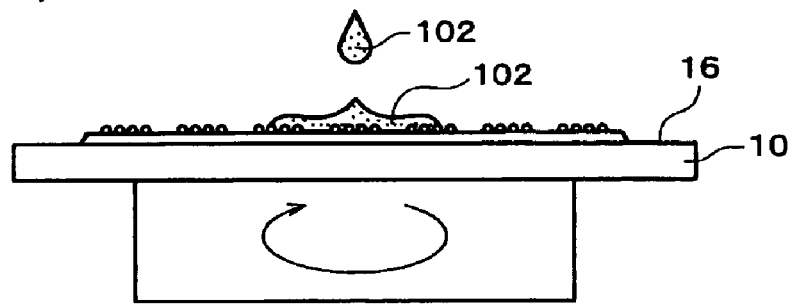
FIGS. 10(A) through 10(C) show a method of manufacturing a semiconductor device according to a third embodiment of the present invention.
Figure 10:
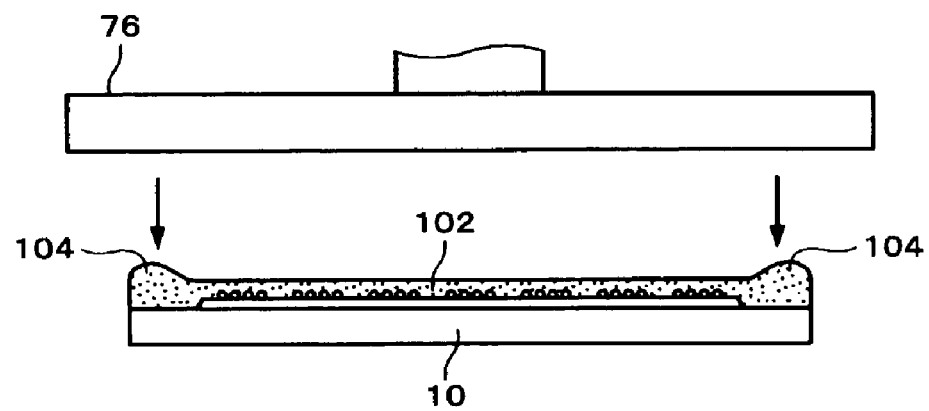
Figure 10:
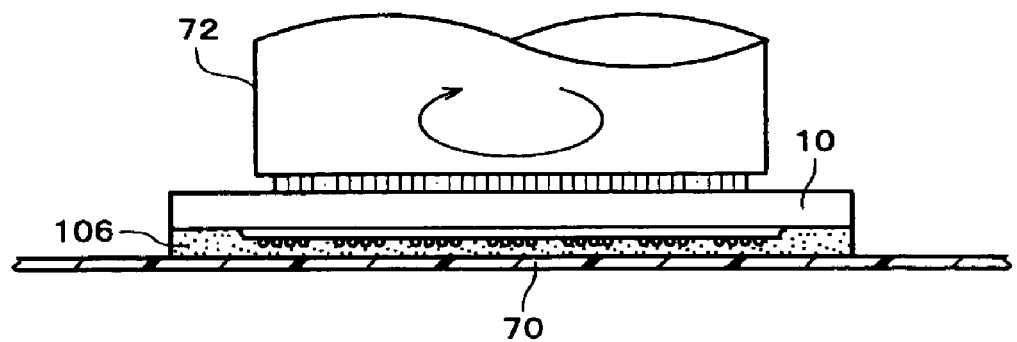

FIGS. 10(A) through 10(C) are drawings explaining a method of manufacturing a semiconductor device according to a third embodiment of the present invention. In this embodiment, a support 106 used in the grinding process is formed by a spin coating method.

As shown in FIG. 10(A), resin 102 is spin-coated on the first surface 16 of the semiconductor substrate 10. Specifically, the resin 102 is dropped while turning the semiconductor substrate 10 around an axis perpendicular to the surface of the semiconductor substrate 10. The resin 102 may be dropped on the center part of the semiconductor substrate 10. Thus, the resin 102 is provided on all over the first surface 16 of the semiconductor substrate 10.

As shown in FIG. 10(B), a raised portion 104 of the resin 102 maybe formed on the second area 30 of the semiconductor substrate 10. This can avoid the shortage of the height of the resin 102 on the second area 30 of the semiconductor substrate 10. The raised portion 104 is raised higher than the center part of the semiconductor substrate 10. The width (width in the direction perpendicular to the circumference) and the height of the raised portion 104 may be adjusted accordingly by selecting various parameters such as a rotational speed or a rotating period of the semiconductor substrate 10, and properties of the resin 102 (e.g., viscosity). The width and the height of the raised portion 104 is preferably adjusted so that a surface opposite to a surface facing to the semiconductor substrate 10, of the support 106 becomes almost flat when pressed afterward.

Then, the raised portion 104 may be eliminated by pressing with a tool 76. Thus, as shown in FIG. 10(C), the support 106 having almost flat surface on a side opposite to the semiconductor substrate 10 is formed. In the grinding process, the semiconductor substrate 10 may be grinded on the tape 70. Otherwise, the tape 70 may be not used. Here, the raised portion 104 may be left without being eliminated in the grinding process.

As a modification, the raised portion 104 may be not formed. In this case, it is sufficient to adjust settings by selecting above-mentioned various parameters so that the surface of the support 106 opposite to the semiconductor substrate 10 becomes almost flat. According to the present embodiment, the support 106 may be easily formed.

Figure 11:
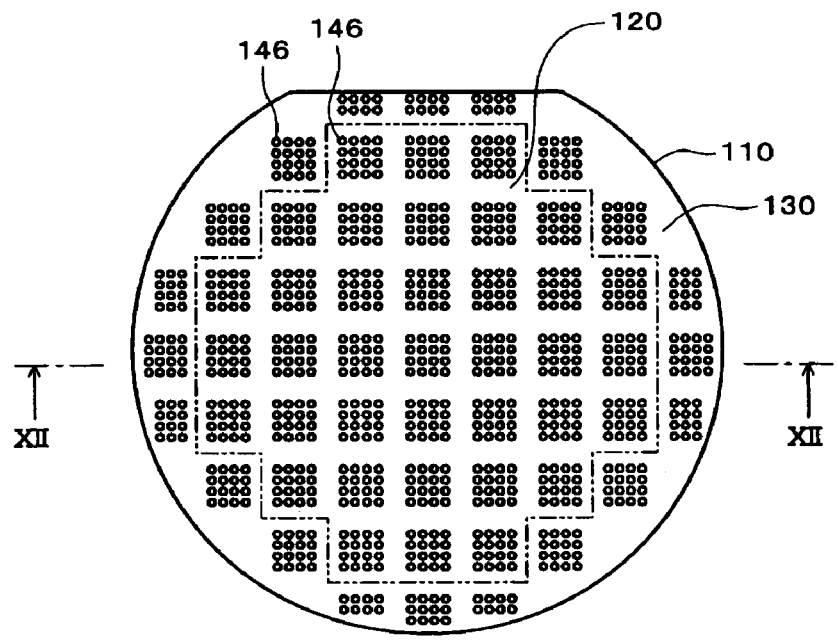
FIG. 11 shows a semiconductor device used in a fourth embodiment of the present invention.
Figure 13:
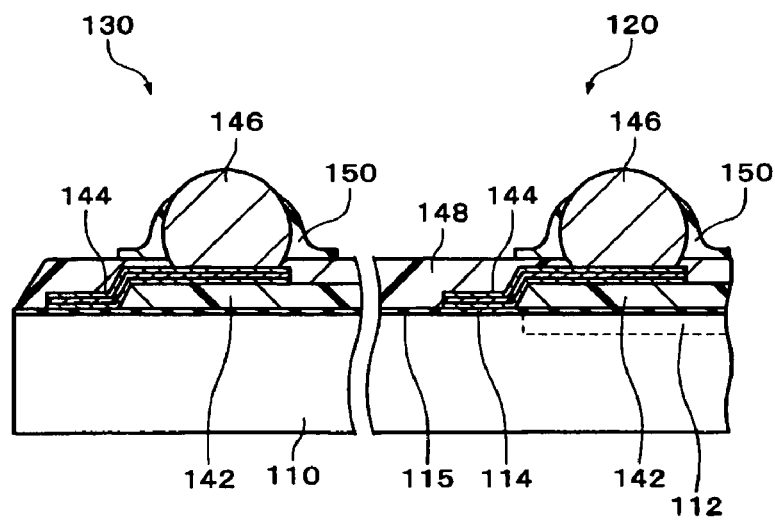
FIG. 13 is a partial enlarged view of the semiconductor substrate of FIG. 12.

FIGS. 11 through 14 are drawings explaining a method of manufacturing a semiconductor device according to a fourth embodiment of the present invention. In the present embodiment, a semiconductor substrate 110 is used. Here, FIG. 11 shows a plan view of the semiconductor substrate. FIG. 12 shows a cross-sectional view along XII—XII line of FIG. 11. FIG. 13 shows a partial enlarged view of the semiconductor substrate of FIG. 12. In the present embodiment, an at least one kind of member 140 (e.g., resin layers 142, 148 and 150, wiring 144, and a protruding electrode 146) is disposed on at least a part of a second area 130 so that the at least one kind of member 140 formed on the second area 130 has almost same height as the height of the at least one kind of member 140 formed on a first area 120 (see FIGS. 2 and 3). Here, the at least one kind of member 140 is a member which is disposed on the first area 120 to become a part of a product (a part of a semiconductor device), and it should be understood that it is not limited to the example explained in this embodiment.

The semiconductor substrate 110 has an integrated circuit 112, a pad 114 and a protective layer 115, the details of which are as described above. The at least one kind of member 140 is disposed on a first surface 116 (including the first area 120 and the second area 130) of the semiconductor substrate 110. Note that the first area 120 is an area that is inside a chain double-dashed line shown in FIG. 11, and the second area 130 is an area that is outside the chain double-dashed line. Here, details of the first area 120 and the second area 130 are as described above.

As shown in FIG. 1, the at least one kind of member 140 may be provided on a part of the second area 130. The at least one kind of member 140 may be provided on the outer end except an outermost periphery, or may be provided only on the outermost periphery. Otherwise, the at least one kind of member 140 may be disposed all over the second area 130 (i.e. all over the first surface 16).

As shown in FIG. 13, a structure of a part of the at least one kind of member 140 disposed on the second area 130 may be the same as that disposed on the first area 120. Note that no integrated circuits and no pads are formed on the second area 130 in the example shown in FIG. 13. Namely, in the example shown in FIG. 13, dummy wiring (the wiring 144) and a dummy terminal (the protruding electrode 146) are formed on the second area 130. Details of the resin layers 142, 148 and 150, the wiring 144, and the protruding electrode 146 are as described above.

Figure 14:
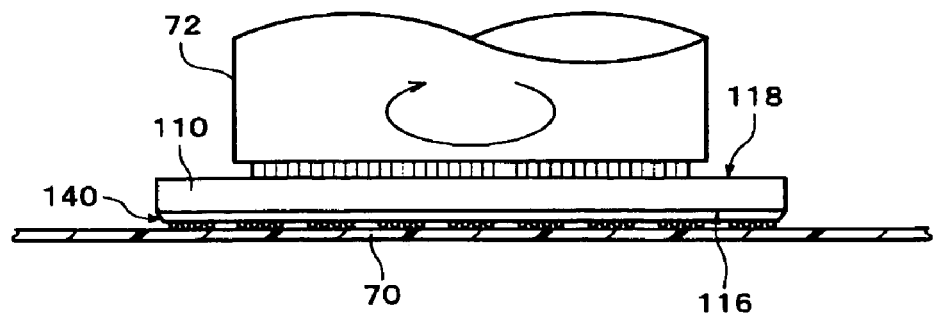
FIG. 14 shows a method of manufacturing a semiconductor device according to the fourth embodiment of the present invention.

As shown in FIG. 14, the second surface 118 of the semiconductor substrate 10 is grinded. The resin layers 142, 148 and 150, the wiring 144, and the protruding electrode 146 are formed on at least a part of the second area 130 of the first surface 116. The at least one kind of member 140 provided on the second area 130 becomes a support for the semiconductor substrate 110.

According to the present embodiment, the at least one kind of member 140 is disposed on at least a part of the second area 130 so that the height of the at least one kind of member 140 disposed on the second area 130 is almost same as that disposed on the first area 120. Thus, since the second area 130 is supported, bending of the semiconductor substrate 110 due to stress during grinding can be greatly reduced. Therefore, the semiconductor substrate 110 can be grinded so that it has almost uniform thickness.

Figure 15:
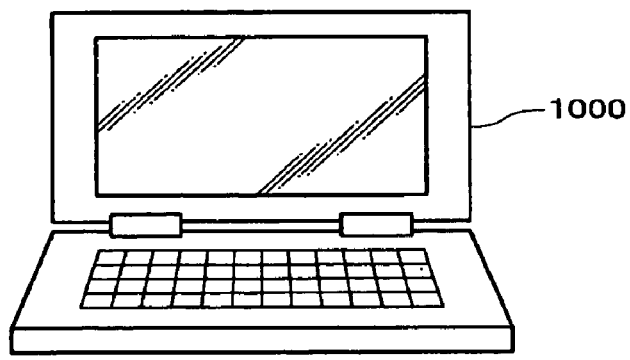
FIG. 15 shows an electronic apparatus according to an embodiment of the present invention.
Figure 16:
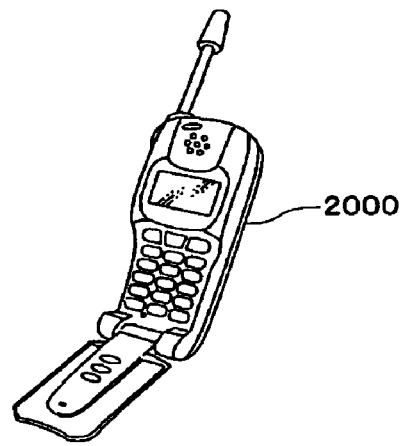
FIG. 16 shows an electronic apparatus according to an embodiment of the present invention.

As an electronic apparatus having the semiconductor device according to the embodiments of the present invention, FIG. 15 shows a laptop personal computer 1000, and FIG. 16 shows a cellular phone 2000.

It should be understood that the present invention is not limited to above-mentioned embodiments, but can be applied to various kinds of modifications. For example, the present invention includes almost same structure (e.g. a structure with the same function, method and result, or a structure with the same purpose and result) as the structure explained in the above embodiments. Furthermore, the present invention can include a structure obtained by replacing a non-essential part of the structure explained in the above embodiments. In addition, the present invention can include a structure having the same effect or achieving the same object as those of the structure explained in above embodiments. Furthermore, the present invention can include any combination of a structure explained in the embodiments and any art known to the public.

What is claimed is:

1. A method of manufacturing a semiconductor device, comprising:
   forming a protrusion on a semiconductor substrate having a first area and a second area surrounding the first area, the protrusion protruding above the first area;
   disposing a support on a surface of the semiconductor substrate on which the protrusion is formed so that a through hole of the support overlaps with the first area, at least one protrusion is set in an opening of the through hole, a part of the support overlapping with the second area being thicker than another part of the support overlapping with the first area; and
   grinding the semiconductor substrate from a surface opposite to the surface on which the protrusion is formed.

2. The method of manufacturing a semiconductor device according to claim 1, the second area being an outer end of the semiconductor substrate.

3. The method of manufacturing a semiconductor device according to claim 1, the step of disposing the support including forming the support by coating the semiconductor substrate with resin by spin-coating.

4. The method of manufacturing a semiconductor device according to claim 3, the step of disposing the support including forming a raised portion of the resin on the second area.

5. The method of manufacturing a semiconductor device according to claim 3, the step of disposing the support including pressing to planarize a surface of the resin.

6. The method of manufacturing a semiconductor device according to claim 1, the support including an adhesive sheet having an adhesive layer thicker than the height of the protrusion; and
   the step of disposing the support including forming the support by pressing the semiconductor substrate against the adhesive sheet to eject at least a part of the adhesive layer outside the protrusion.

7. The method of manufacturing a semiconductor device according to claim 1, the first area being an area of an effective chip having an integrated circuit and becoming a product; and
   the second area being an area of a periphery chip which does not become a product.

8. The method of manufacturing a semiconductor device according to claim 1, further comprising:
   cutting the semiconductor substrate with the support disposed on the semiconductor substrate after the step of grinding the semiconductor substrate.

9. The method of manufacturing a semiconductor device according to claim 1, further comprising:
   removing the support from the semiconductor substrate after the step of grinding the semiconductor substrate.

10. A semiconductor device manufactured by the method according to claim 1.

11. A circuit board equipped with the semiconductor device according to claim 10.

12. An electronic apparatus comprising the semiconductor device according to claim 10.

13. A method of manufacturing a semiconductor device, comprising:
    disposing a resin layer on a first area of a semiconductor substrate, the semiconductor substrate having a second area surrounding the first area;
    disposing a support on a surface of the semiconductor substrate on which the resin layer is disposed so that a through hole of the support overlaps with the first area, at least a protrusion on the resin layer is set in an opening of the through hole, a part of the support overlapping with the second area being thicker than another part of the support overlapping with the first area; and
    grinding the semiconductor substrate from a surface opposite to the surface on which the resin layer is disposed.

14. The method of manufacturing a semiconductor device according to claim 13, the support including an adhesive sheet having an adhesive layer thicker than the thickness of the resin layer; and
    the step of disposing the support further including forming the support by pressing the semiconductor substrate against the adhesive sheet to eject at least a part of the adhesive layer outside the resin layer.

15. The method of manufacturing a semiconductor device according to claim 13, the second area being an outer end of the semiconductor substrate.

16. The method of manufacturing a semiconductor device according to claim 13, the step of disposing the support including forming the support by coating the semiconductor substrate with resin by spin-coating.

17. The method of manufacturing a semiconductor device according to claim 16, the step of disposing the support including forming a raised portion of the resin on the second area.

18. The method of manufacturing a semiconductor device according to claim 16, the step of disposing the support including pressing to planarize a surface of the resin.

19. The method of manufacturing a semiconductor device according to claim 13, the first area being an area of an effective chip having an integrated circuit and becoming a product; and
    the second area being an area of a periphery chip which does not become a product.

20. The method of manufacturing a semiconductor device according to claim 13, further comprising:
    cutting the semiconductor substrate with the support disposed on the semiconductor substrate after the step of grinding the semiconductor substrate.

21. The method of manufacturing a semiconductor device according to claim 13, the first area being an area of an effective chip having an integrated circuit and becoming a product; and
    the second area being an area of a periphery chip which does not become a product.

22. The method of manufacturing a semiconductor device according to claim 13, further comprising:
    cutting the semiconductor substrate with the support disposed on the semiconductor substrate after the step of grinding the semiconductor substrate.

23. A method of manufacturing a semiconductor device, comprising:

disposing a resin layer on a first area of a semiconductor substrate, the semiconductor substrate having a second area surrounding the first area;

disposing a protruding electrode on the resin layer;

disposing a support on a surface of the semiconductor substrate on which the resin layer is disposed so that a through hole of the support overlaps with the first area, at least the protruding electrode is set in an opening of the through hole, a part of the support overlapping with the second area being thicker than another part of the support overlapping with the first area; and grinding the semiconductor substrate from a surface opposite to the surface on which the resin layer is disposed.

24. The method of manufacturing a semiconductor device according to claim 23, the support including an adhesive sheet having an adhesive layer thicker than the total thickness of the resin layer and the protruding electrode; and the step of disposing the support including forming the support by pressing the semiconductor substrate against the adhesive sheet to eject at least a part of the adhesive layer outside the resin layer and the protruding electrode.

25. The method of manufacturing a semiconductor device according to claim 23, the second area being an outer end of the semiconductor substrate.

26. The method of manufacturing a semiconductor device according to claim 23, the step of disposing the support including forming the support by coating the semiconductor substrate with resin by spin-coating.

27. The method of manufacturing a semiconductor device according to claim 26, the step of disposing the support including forming a raised portion of the resin on the second area.

28. The method of manufacturing a semiconductor device according to claim 26, the step of disposing the support including pressing to planarize a surface of the resin.

29. The method of manufacturing a semiconductor device according to claim 23, the first area being an area of an effective chip having an integrated circuit and becoming a product; and the second area being an area of a periphery chip which does not become a product.

30. The method of manufacturing a semiconductor device according to claim 23, further comprising:

cutting the semiconductor substrate with the support disposed on the semiconductor substrate after the step of grinding the semiconductor substrate.

31. The method of manufacturing a semiconductor device according to claim 23, the first area being an area of an effective chip having an integrated circuit and becoming a product; and the second area being an area of a periphery chip which does not become a product.

32. The method of manufacturing a semiconductor device according to claim 23, further comprising:

cutting the semiconductor substrate with the support disposed on the semiconductor substrate after the step of grinding the semiconductor substrate.

33. A method of manufacturing a semiconductor device, comprising:

forming a protrusion on a semiconductor substrate having a first area and a second area surrounding the first area, the protrusion protruding above the first area;

disposing a support on a surface of the semiconductor substrate on which the protrusion is formed, so that a through hole of the support overlaps with the first area and the protrusion is set in an opening of the through hole; and grinding the semiconductor substrate from a surface opposite to the surface on which the protrusion is formed.

34. The method of manufacturing a semiconductor device according to claim 33, the second area being an outer end of the semiconductor substrate.

35. The method of manufacturing a semiconductor device according to claim 34, the support being formed on the periphery of the through hole and has a step that disposes an outer end of the semiconductor substrate.

36. The method of manufacturing a semiconductor device according to claim 33, the support being made of resin.

37. The method of manufacturing a semiconductor device according to claim 36, the step of disposing the support including curing the resin.

38. The method of manufacturing a semiconductor device according to claim 33, the first area being an area of an effective chip having an integrated circuit and becoming a product; and the second area being an area of a periphery chip which does not become a product.

39. The method of manufacturing a semiconductor device according to claim 33, further comprising:

cutting the semiconductor substrate with the support disposed on the semiconductor substrate after the step of grinding the semiconductor substrate.

40. The method of manufacturing a semiconductor device according to claim 33, the first area being an area of an effective chip having an integrated circuit and becoming a product; and the second area being an area of a periphery chip which does not become a product.

41. The method of manufacturing a semiconductor device according to claim 33, further comprising:

cutting the semiconductor substrate with the support disposed on the semiconductor substrate after the step of grinding the semiconductor substrate.

42. A method of manufacturing a semiconductor device, comprising:

disposing a resin layer on a first area of a semiconductor substrate, the semiconductor substrate having a second area surrounding the first area;

disposing a support on a surface of the semiconductor substrate on which the resin layer is disposed, so that a through hole of the support overlaps with the first area and at least a protrusion on the resin layer is set in an opening of the through hole; and grinding the semiconductor substrate from a surface opposite to the surface on which the resin layer is disposed.

43. The method of manufacturing a semiconductor device according to claim 42, the first area being an area of an effective chip having an integrated circuit and becoming a product; and the second area being an area of a periphery chip which does not become a product.

44. The method of manufacturing a semiconductor device according to claim 42, further comprising:

cutting the semiconductor substrate with the support disposed on the semiconductor substrate after the step of grinding the semiconductor substrate.

45. The method of manufacturing a semiconductor device according to claim 42, the support being made of resin.

46. The method of manufacturing a semiconductor device according to claim 45, the step of disposing the support including curing the resin.

47. The method of manufacturing a semiconductor device according to claim 42, the first area being an area of an effective chip having an integrated circuit and becoming a product; and the second area being an area of a periphery chip which does not become a product.

48. The method of manufacturing a semiconductor device according to claim 42, further comprising:

cutting the semiconductor substrate with the support disposed on the semiconductor substrate after the step of grinding the semiconductor substrate.

49. A method of manufacturing a semiconductor device, comprising:

disposing a resin layer on a first area of a semiconductor substrate, the semiconductor substrate having a second area surrounding the first area;

disposing a protruding electrode on the resin layer;

disposing a support on a surface of the semiconductor substrate on which the resin layer is disposed, so that a through hole of the support overlaps with the first area, at least one protruding electrode is set in an opening of the through hole; and grinding the semiconductor substrate from a surface opposite to the surface on which the resin layer is disposed.

50. The method of manufacturing a semiconductor device according to claim 49, the first area being an area of an effective chip having an integrated circuit and becoming a product; and the second area being an area of a periphery chip which does not become a product.

51. The method of manufacturing a semiconductor device according to claim 49, further comprising:

cutting the semiconductor substrate with the support disposed on the semiconductor substrate after the step of grinding the semiconductor substrate.

52. The method of manufacturing a semiconductor device according to claim 49, the support being made of resin.

53. The method of manufacturing a semiconductor device according to claim 52, the step of disposing the support including curing the resin.

54. The method of manufacturing a semiconductor device according to claim 49, the first area being an area of an effective chip having an integrated circuit and becoming a product; and the second area being an area of a periphery chip which does not become a product.

55. The method of manufacturing a semiconductor device according to claim 49, further comprising:

cutting the semiconductor substrate with the support disposed on the semiconductor substrate after the step of grinding the semiconductor substrate.

56. A method of manufacturing a semiconductor device, comprising:

disposing a resin layer on a first and a second areas of a semiconductor substrate, the first area becoming a product and the second area surrounding the first area not becoming a product;

disposing a protruding electrode on the resin layer and above the first and the second areas;

disposing a support on a surface of the semiconductor substrate so that a through hole of the support overlaps with the first area of the semiconductor substrate and the protruding electrode is set in an opening of the through hole, grinding the semiconductor substrate from a surface opposite to the surface on which the resin layer is disposed.

57. The method of manufacturing a semiconductor device according to claim 56, the second area including an area of a part which includes a side face of the semiconductor substrate and becomes a semiconductor chip.

* * * * *